(12) United States Patent
Sjöland et al.

(10) Patent No.: US 10,003,346 B2
(45) Date of Patent: Jun. 19, 2018

(54) FRACTIONAL PLLS WITH LOW CORRELATION

(71) Applicant: Telefonaktiebolaget LM Ericsson (publ), Stockholm (SE)

(72) Inventors: Henrik Sjöland, Lund (SE); Staffan Ek, Lund (SE); Tony Påhlsson, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days. days.

(21) Appl. No.: 15/556,335

(22) PCT Filed: Mar. 20, 2015

(86) PCT No.: PCT/EP2015/056002
§ 371 (c)(1),
(2) Date: Sep. 7, 2017

(87) PCT Pub. No.: WO2016/150471
PCT Pub. Date: Sep. 29, 2016

(65) Prior Publication Data
US 2018/0102783 A1    Apr. 12, 2018

(51) Int. Cl.
*H04B 7/00*    (2006.01)
*H03L 7/197*    (2006.01)
(Continued)

(52) U.S. Cl.
CPC .......... *H03L 7/1976* (2013.01); *H03L 7/0802* (2013.01); *H03L 7/185* (2013.01); *H04B 7/0617* (2013.01); *H03L 2207/12* (2013.01)

(58) Field of Classification Search
CPC ..... H03L 7/1976; H03L 7/0802; H03L 7/185; H04B 7/0617
(Continued)

(56) References Cited

U.S. PATENT DOCUMENTS 5,391,996 A    2/1995   Marz
6,642,758 B1   11/2003   Wang et al.
(Continued)

FOREIGN PATENT DOCUMENTS

EP    1085678 A2    3/2001
EP    1274181 A1    1/2003
(Continued)

OTHER PUBLICATIONS

Axholt, A., et al., "A PLL based 12 GHz LO generator with digital phase control in 90 nm CMOS", Analog Integrated Circuits and Signal Processing, vol. 67, No. 3, pp. 309-318, Feb. 24, 2011.
(Continued)

*Primary Examiner* — Sanh Phu
(74) *Attorney, Agent, or Firm* — Coats & Bennett, PLLC

(57) ABSTRACT

The programmable frequency control system presented herein provides frequency programmability and phase noise reduction for signals generated by a plurality of frequency programmable phase-locked loops (PLLs). In general, a modulated data stream input to each of the plurality of PLLs controls the frequency of the signal output by the PLLs. The solution presented herein reduces the phase noise by introducing a time shift to the modulated data stream applied to at least some of the PLLs so that at least some of the PLLs receive time-shifted versions of the modulated data stream relative to other PLLs. In so doing, the solution presented herein decorrelates the quantization noise generated by the plurality of frequency programmable PLLs.

20 Claims, 9 Drawing Sheets

(51) Int. Cl.
*H03L 7/185* (2006.01)
*H03L 7/08* (2006.01)
*H04B 7/06* (2006.01)

(58) Field of Classification Search
USPC ........................................ 455/260
See application file for complete search history.

(56) References Cited

U.S. PATENT DOCUMENTS

| | | | |
|---|---|---|---|
| 7,098,754 B2* | 8/2006 | Humphreys | H03C 3/0966 332/103 |
| 7,463,710 B2 | 12/2008 | Walsh et al. | |
| 7,893,736 B2* | 2/2011 | Palmer | H03L 7/07 327/147 |
| 8,810,290 B1 | 8/2014 | Cloutier et al. | |
| 2002/0140512 A1 | 10/2002 | Stockton | |
| 2008/0116949 A1* | 5/2008 | Nair | H03L 7/0805 327/158 |
| 2009/0174492 A1* | 7/2009 | Zhang | H03L 7/085 331/1 R |
| 2010/0259307 A1 | 10/2010 | Kondou | |
| 2011/0028141 A1 | 2/2011 | Yang et al. | |
| 2011/0043289 A1 | 2/2011 | Wan et al. | |
| 2012/0062297 A1 | 3/2012 | Keaveney et al. | |
| 2014/0062537 A1* | 3/2014 | Kitsukawa | H03L 7/087 327/107 |

FOREIGN PATENT DOCUMENTS

| | | |
|---|---|---|
| FR | 2647986 A1 | 12/1990 |
| GB | 2356989 A | 6/2001 |
| GB | 2469473 A | 10/2010 |
| WO | 2007130750 A2 | 11/2007 |
| WO | 2016173614 A1 | 11/2016 |

OTHER PUBLICATIONS

Axholt, A., et al., "A 60 GHz receiver front-end with PLL based phase controlled LO generation for phased-arrays", Submitted to IEEE Proceedings Asia Pacific Microwave Conference, APMC 2011, Dec. 1, 2011, Melbourne, Australia.

* cited by examiner

FRACTIONAL PLLS WITH LOW CORRELATION

TECHNICAL FIELD

The solutions presented herein relate to Radio Frequency (RF) integrated circuits, frequency synthesizers, Phase-Locked Loops (PLLs), phase noise, beamforming, 5G wireless systems, etc.

BACKGROUND

Wireless systems typically upconvert a baseband signal to a Radio Frequency (RF) for transmission, and downconvert received RF signals to baseband for processing. Such frequency conversion requires producing a reliable mixing frequency signal, typically referred to as a local oscillator (LO) signal, for use in the RF front-end of a wireless device. Phase-Locked Loops (PLLs) are often used to provide such mixing frequency signals.

In some cases, stringent requirements are placed on the mixing frequency signal, such as produced by a PLL. For example, it is foreseen that 5G cellular systems will use millimeter waves, where the frequencies currently in discussion range between 15 GHz and 60 GHz. In order to use such 5G system outdoors, a longer cyclic prefix has to be used compared to newly released 60 GHz indoor systems. Such longer cyclic prefixes necessitate a closer sub-carrier spacing in the OFDM modulation. This closer sub-carrier spacing poses stringent phase noise requirements on the output of the PLLs. At the same time, beamforming should be supported to increase the range and capacity of the system, which results in a large number of antenna elements. The signal at each antenna element of a beamforming system will have an individual phase shift that controls the beam. In some implementations, the beam controlling phase shifts are imposed on the mixing signal. In any event, accurate phase shifts are required to provide accurate beamforming. It is also desirable to be able to program the frequency of the mixing signal to enable the wireless device to operate on different frequency channels and in different bands.

As a result of all of these considerations, there is a need to improve the generation of the mixing frequency signals so as to provide the desired frequency programmability and to provide improved phase noise performance, particularly in light of possible future 5G systems.

SUMMARY

The solution presented herein provides frequency programmability and phase noise reduction for signals generated by a plurality of frequency programmable phase-locked loops (PLLs), e.g., fractional N frequency programmable PLLs. To that end, the solution presented herein introduces a time shift to a modulated data stream applied to at least some of the PLLs so that at least some of the PLLs receive time-shifted versions of the modulated data stream relative to other PLLs, where the time-shifted data streams assist with the control of the frequency of the PLL output signals. In so doing, the solution presented herein decorrelates the quantization noise generated by the plurality of frequency programmable PLLs.

One exemplary embodiment comprises a method of decorrelating quantization noise generated by a plurality of frequency programmable PLLs. The method comprises generating a first modulated data stream based on a first frequency control word, where the first frequency control word is configured to control a first frequency output by at least some of the plurality of PLLs. The method also comprises generating a first data stream based on the first modulated data stream and shifting the first modulated data stream by a first time shift to generate a second data stream. The method further comprises applying the first data stream to a first PLL of the plurality of PLLs to produce, at an output of the first PLL, a first output signal at the first frequency and having a first quantization noise component. The method also comprises applying the second data stream to a second PLL of the plurality of PLLs to produce, at an output of the second PLL, a second output signal at the first frequency and having a second quantization noise component decorrelated from the first quantization noise component.

Another exemplary embodiment comprises a programmable frequency control system for controlling a plurality of frequency programmable PLLs. The programmable frequency control system comprises a modulator and a delay circuit. The modulator is configured to generate a first modulated data stream based on a first frequency control word input to the modulator, where the first frequency control word is configured to control a first frequency output by at least some of the plurality of PLLs. The delay circuit is operatively coupled to an output of the modulator and is configured to generate a first data stream based on the first modulated data stream and shift the first modulated data stream by a first time shift to generate a second data stream. The delay circuit is further configured to apply the first data stream to a first PLL of the plurality of PLLs to produce, at an output of the first PLL, a first output signal at the first frequency and having a first quantization noise component. The delay circuit is also configured to apply the second data stream to a second PLL of the plurality of PLLs to produce, at an output of the second PLL, a second output signal at the first frequency and having a second quantization noise component decorrelated from the first quantization noise component.

Another exemplary embodiment comprises a computer program product stored in a non-transitory computer readable medium for decorrelating quantization noise produced by a plurality of frequency programmable PLLs. The computer program product comprises software instructions which, when run in a wireless control circuit, causes the wireless control circuit to generate a first modulated data stream based on a first frequency control word, where the first frequency control word is configured to control a first frequency output by at least some of the plurality of PLLs. The software instructions also cause the wireless control circuit to generate a first data stream based on the first modulated data stream and shift the first modulated data stream by a first time shift to generate a second data stream. The software instructions also cause the wireless control circuit to apply the first data stream to a first PLL of the plurality of PLLs to produce, at an output of the first PLL, a first output signal at the first frequency and having a first quantization noise component. The software instructions also cause the wireless control circuit to apply the second data stream to a second PLL of the plurality of PLLs to produce, at an output of the second PLL, a second output signal at the first frequency and having a second quantization noise component decorrelated from the first quantization noise component.

Another exemplary embodiment comprises a beamforming system comprising the programmable frequency control system described herein.

DETAILED DESCRIPTION

Figure 1A:
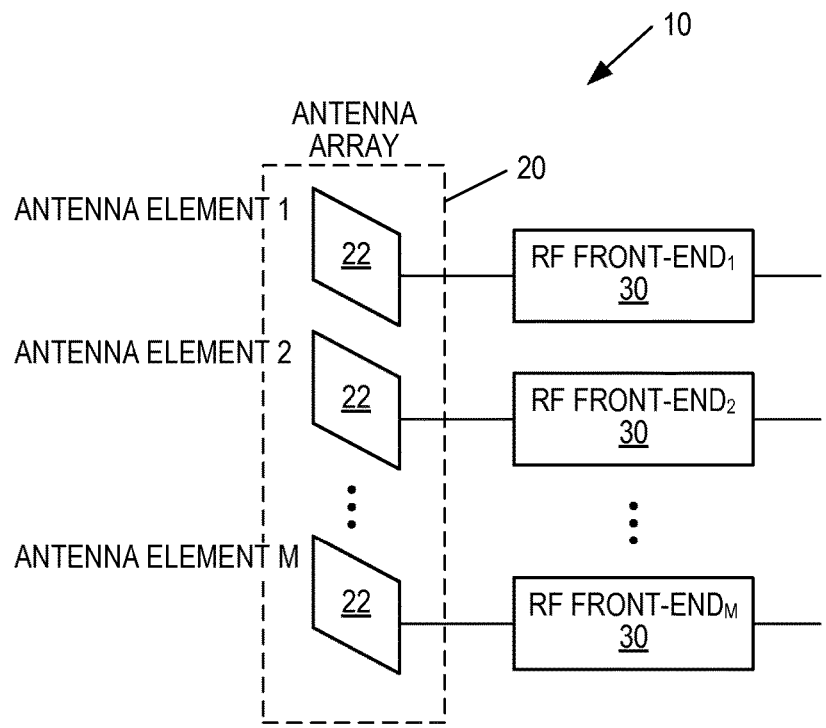
FIG. 1A shows a simplified block diagram of an exemplary beam forming system.
Figure 1B:
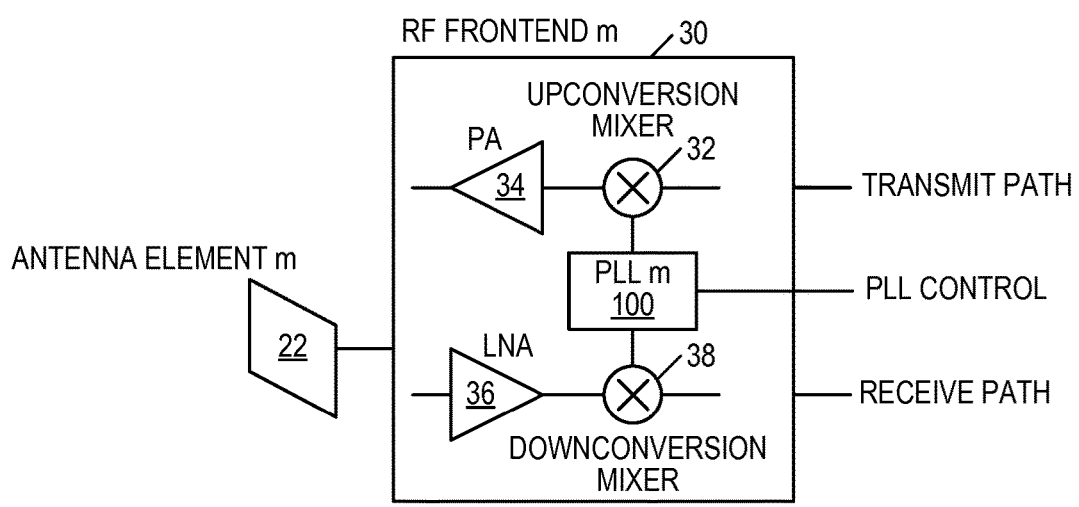
FIG. 1B shows a simplified block diagram of an exemplary RF front-end.

FIG. 1A shows a beamforming system 10 comprising an antenna array 20 with M antenna elements 22, where each antenna element 22 is coupled to a corresponding radio frequency (RF) front end 30. Each RF front end 30 comprises a phase-locked loop (PLL) 100 coupled to a transmission path and a reception path, as shown in FIG. 1B. On the transmission side, an upconversion mixer 32 operatively coupled to the output of the PLL 100 upconverts an input signal responsive to the frequency of the output signal supplied by the PLL 100. An amplifier 34, e.g., a power amplifier, amplifies the upconverted signal for transmission by the corresponding antenna element 22. On the receiving side, an amplifier 36, e.g., a low-noise amplifier, amplifies signals received by the corresponding antenna element 22. A downconversion mixer 38 downconverts the received and amplified signal responsive to the frequency of the output signal supplied by the PLL 100. It will be appreciated that FIGS. 1A and 1B show simplified block diagrams of the exemplary beamforming system 10 and RF front-end 30. Other components not pertinent to the discussion have been excluded from the drawings for simplicity.

The PLLs 100 in the RF front-end circuits 30 of an RF system each receive a common reference signal, either directly from a reference oscillator or from a reference PLL. The PLLs 100 then locally multiply the reference signal to a higher (RF) frequency. By using the common reference signal, the output signals of the PLLs 100 will be fixed in frequency and phase. When part of a beamforming system, each PLL 100 can also include separate phase control for beamforming purposes. To control the direction of the beam for the antenna array 20, the phase of the transmission signal applied to at least some of the antenna elements 22 (or of the reception signal received from at least some of the antenna elements 22) must be accurately controlled. This may be achieved, e.g., by controlling the PLL 100 to control the phase of the PLL output signal responsive to a phase control signal input to the PLL 100. For example, digitally controlled current sources may be used to inject current into the loop filters (not shown) of each PLL 100 to produce an accurately controlled and linear phase shift of the PLL output signal responsive to a phase control signal. In some embodiments, the PLL phase control signal indicates the desired phase shift of the PLL output signal, where the desired phase shift was determined by a controller (not shown) external to the PLL 100, e.g., an array controller, based on a location of the antenna element 22 in the antenna array 20, a desired beam direction, and/or a desired beam shape. In other embodiments, the PLL phase control signal indicates the location of the antenna element 22 in the antenna array 20, the desired beam direction, and/or the desired beam shape, and the PLL 100 determines or otherwise selects the desired phase shift based on the information provided by the PLL phase control signal.

To achieve frequency programmability, the solution presented herein uses programmable PLLs 100 to generate the PLL output signals from a common (and sometimes fixed) reference frequency. For example, the PLLs 100 may comprise fractional-N PLLs. The frequency of each PLL 100 is controlled/programmed by a data stream applied to the PLL 100, where the data stream is generated based on a frequency control word. For example, the data stream may be applied to a programmable frequency divider (not shown) in the feedback path of the PLL 100 to control the frequency of the mixing signal output by the PLL 100. To achieve reduced effective quantization noise in the multi-antenna receiver and/or transmitter, the solution presented herein makes the quantization noise of the PLL output signals independent. When the quantization noise is independent, the effective quantization noise of the system will be suppressed by up to $10*\log(N)$dB, where N represents the number of local PLLs 100 having independent output signals. For N=10, e.g., the quantization noise can thus be suppressed by 10 dB. When the quantization noise of all the PLLs 100 in the beamforming system 10 is independent, N=M.

To make the quantization noise of the PLL output signals sufficiently independent, the solution presented herein applies different time delays to the modulated data stream (generated from at least part of the frequency control word, e.g., the fractional part of the frequency control word) being applied to different PLLs 100, where the frequency control word is configured to control the frequency of the PLL output signals as discussed above. For example, instead of applying the same modulated data stream to all of the PLLs 100 at the same time, the solution presented herein applies the modulated data stream to the corresponding PLLs 100 at different times. To that end, the solution presented herein delays the modulated data stream by different amounts before application to the corresponding PLLs 100. The differently delayed versions of the modulated data stream can be extracted from a shift register having the modulated data stream as an input and being tapped at different points. The longer the shift register the better the decorrelation of the quantization noise, but the higher the implementation cost in terms of area and power consumption.

Figure 2:
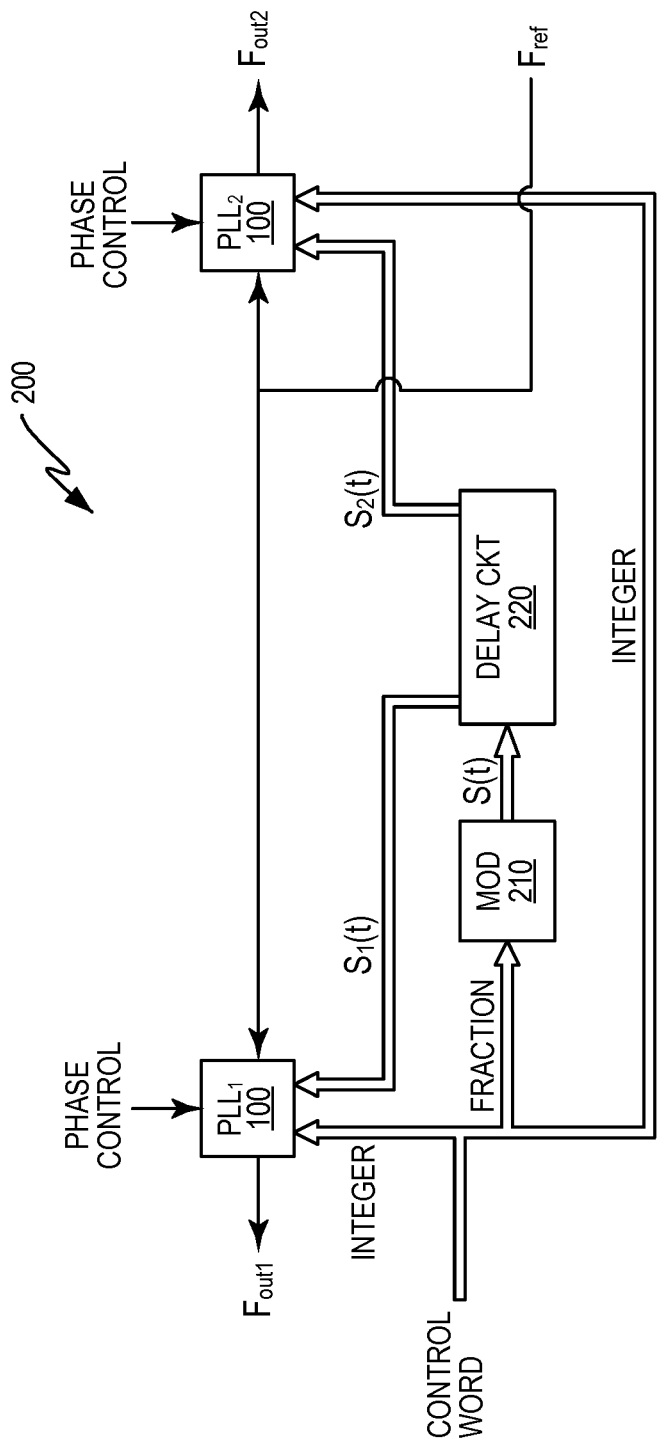
FIG. 2 shows a frequency control system according to one exemplary embodiment.

FIG. 2 shows one exemplary block diagram for a programmable frequency control system 200 for the plurality of PLLs 100. For simplicity, FIG. 2 shows N=2 PLLs 100. It will be appreciated, however, that the solution presented herein applies to any number of PLLs 100. The frequency control system 200 of FIG. 2 comprises a modulation circuit 210 and a delay circuit 220. The delay circuit 220 enables the generation of decorrelated data streams, and thus the generation of PLL output signals with independent quantization noise, even when only one modulation circuit 210 is used to generate the modulated data stream. In the embodiment of FIG. 2, the modulation circuit 210 is configured to generate a (e.g., first) modulated data stream S(t) based on, e.g., the fractional part of a frequency control word input to the modulation circuit 210, and provide the modulated data stream S(t) to the delay circuit 220. Delay circuit 220 is configured to provide delayed versions of the modulated data stream to the corresponding PLLs 100, e.g., by time shifting the modulated data stream to generate the time-shifted data streams applied to at least some of the PLLs 100. For example, delay circuit 220 may generate and apply a first data stream $S_1(t)=S(t-\Delta t_1)$ to $PLL_1$ 100 by essentially applying a time shift of $\Delta t_1$ to the modulated data stream S(t) output by the modulation circuit 210. In some embodiments, $\Delta t_1=0$, while in other embodiments, $\Delta t_1>0$. Delay circuit 220 may further shift the first modulated data stream to generate a second data stream $S_2(t)=S(t-\Delta t_2)$, where $\Delta t_2>\Delta t_1$, and apply the second data stream to $PLL_2$ 100. As a result, the fractional portions of the frequency control word used to control the PLLs 100 are decorrelated, which reduces the effective quantization noise of the multi-antenna transmitter and/or receiver. In exemplary embodiments, the modulation circuit 210 comprises a delta-sigma modulator, and the delay circuit 220 comprises a shift register.

Figure 3:
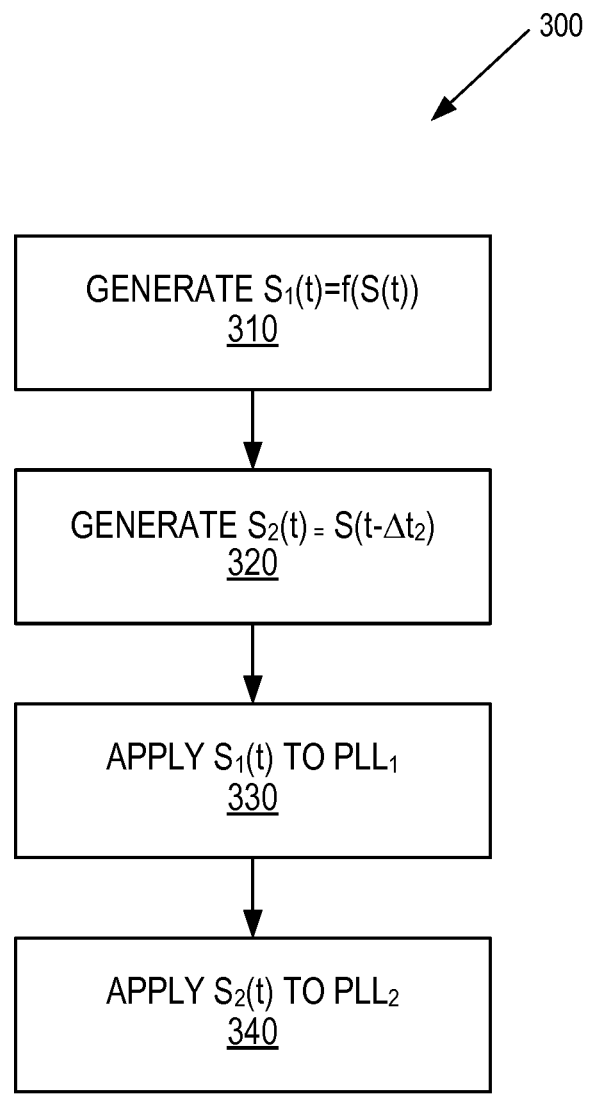
FIG. 3 shows a method for decorrelating quantization noise generated by a plurality of PLLs according to one exemplary embodiment.

FIG. 3 shows one exemplary method 300 for decorrelating quantization noise generated by a plurality of frequency programmable PLLs 100. The modulation circuit 210 generates first modulated data stream S(t) based on the input (first) frequency control word, e.g., based on the fractional portion of the input frequency control word (block 310). Delay circuit 220 shifts S(t) by various time shifts to generate additional time-shifted data streams. For example, delay circuit 220 may generate a first data stream based on the first modulated data stream, e.g., such that the first data stream is a function of the first modulated data stream $(S_1(t)=f(S(t)))$, and generate a second data stream $S_2(t)=S_1(t-\Delta t_2)$ for $PLL_2$ 100 by shifting the first modulated data stream S(t) by $\Delta t_2$ (block 320). Delay circuit 220 then applies the first data stream $S_1(t)$ to $PLL_1$ 100 (block 330) and the second data stream $S_2(t)$ to $PLL_2$ 100 (block 340). As noted above, in some embodiments, the delay circuit 220 may generate the first data stream $S_1(t)$ by applying a time shift $\Delta t_1$ to the first modulated data stream to generate $S_1(t)=S(t-\Delta t_1)$. Thus, while in some embodiments, $\Delta t_1=0$ (e.g., $S_1(t)=S(t)$) and $\Delta t_2>0$, in other embodiments, $\Delta t_2>\Delta t_1>0$.

Figure 4:
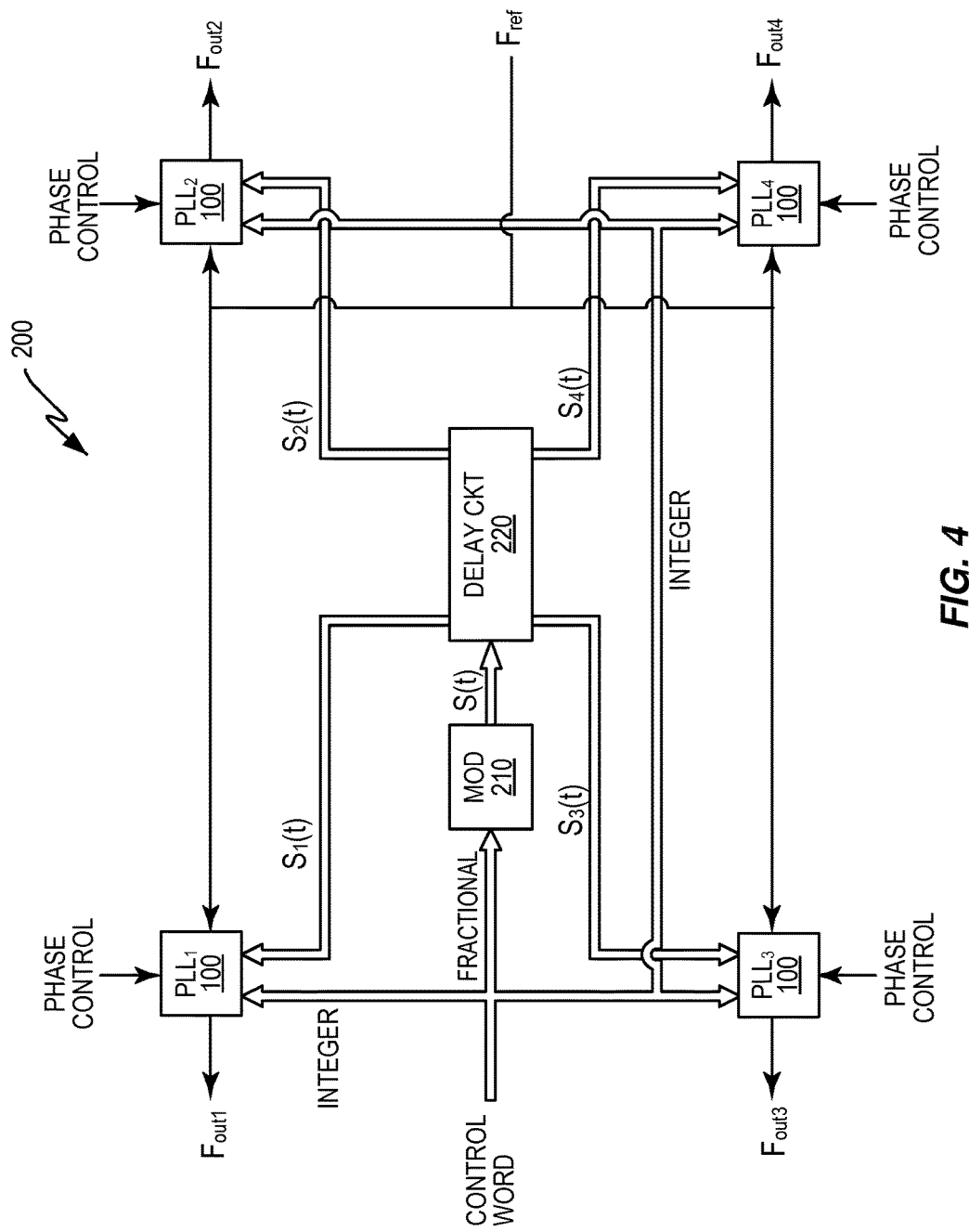
FIG. 4 shows a frequency control system according to another exemplary embodiment.

While FIGS. 2 and 3 describe the solution in terms of N=2 PLLs 100, the exemplary method of FIG. 3 may easily be extended to any number of PLLs 100, e.g., the four PLLs 100 of FIG. 4. For example, delay circuit 220 may generate and apply the first data stream $S_1(t)=S(t-\Delta t_1)$ to $PLL_1$ 100 (where $\Delta t_1 \geq 0$), the second data stream $S_2(t)=S(t-\Delta t_2)$ to $PLL_2$ 100, a third data stream $S_3(t)=S(t-\Delta t_3)$ to $PLL_3$ 100, and a fourth data stream $S_4(t)=S(t-\Delta t_4)$ to $PLL_4$ 100, where $\Delta t_1<\Delta t_2<\Delta t_3<\Delta t_4$.

When using different time-shifted versions of the modulated data stream to control the PLLs 100, the PLLs 100 will lock in different phases. Since the PLLs 100 have phase control, however, this phase difference can be compensated for as long as the phase relations between the PLL output signals are known, which they are when all division number sequences come from a single modulated data stream S(t) with different delays. In particular, the phase difference between the output signals of two PLLs 100 equals the fractional part of the frequency control word (in embodiments where the modulation circuit 210 modulates the fractional part of the frequency control word) multiplied by the number of symbols of time shift between their data streams. For example, if the frequency control word is 40.12, and the modulated data stream is delayed by 3 symbols between the two PLLs 100, the phase difference between the outputs of the two PLLs will be 3*0.12=0.36 cycles. To counteract this effect, all phase differences are calculated with respect to, e.g., the first PLL 100. For example, the phase difference for $PLL_2$ 100 may be determined based on $\Delta t_2$. Compensations for the phase differences are then added to the phase control signals of the other PLLs 100 (or otherwise applied to the PLLs 100) to compensate for the phase differences caused by the time shift(s). It will be appreciated that each time the frequency control word or time shift changes, new phase offsets need to be calculated and applied.

Figure 5:
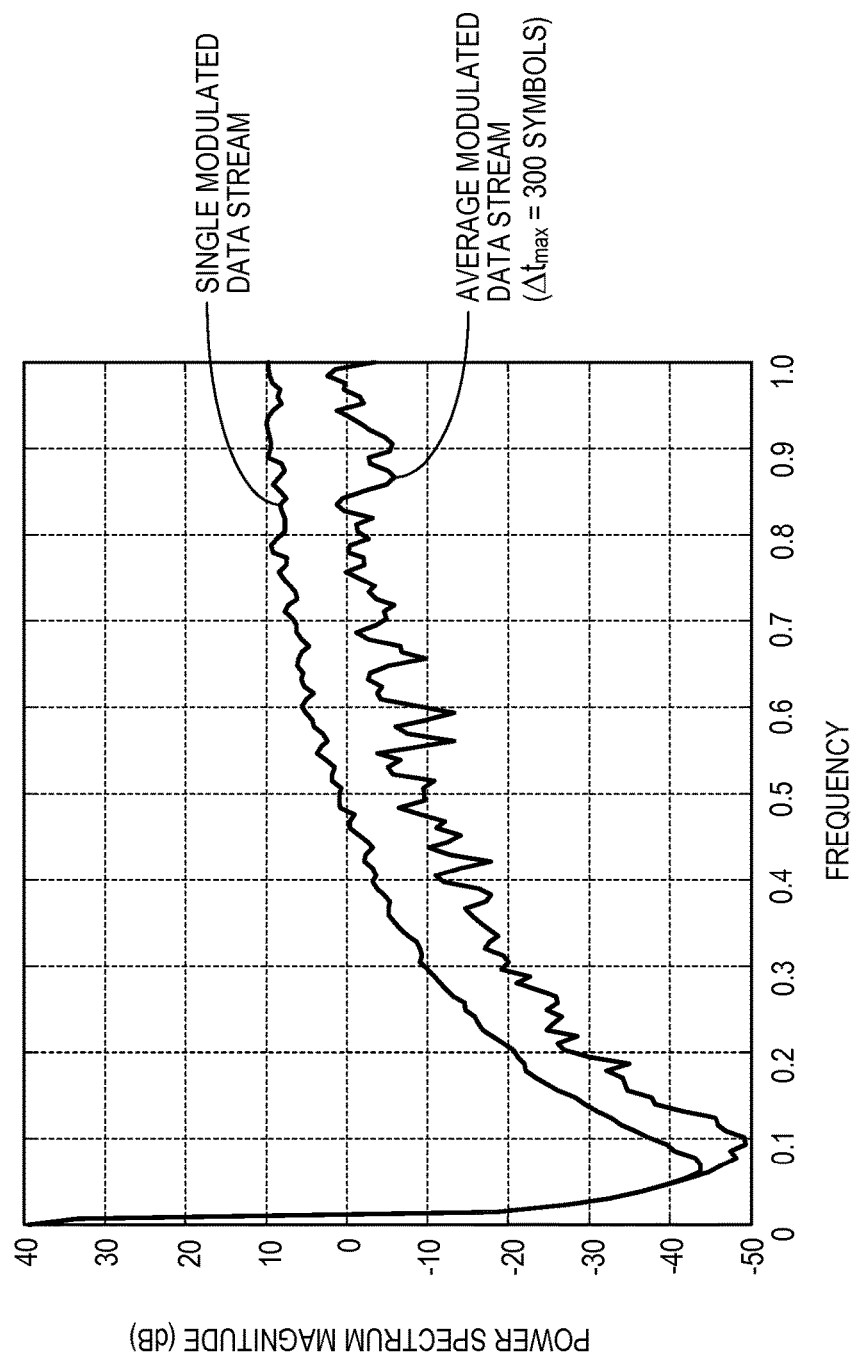
FIG. 5 shows simulation results for the decorrelation solution described herein.

FIG. 5 shows simulation results demonstrating how delaying the modulated data stream before application to the PLL 100 results in sufficiently independent quantization noise for N=10 PLLs 100, where a modulated data stream of 20,000 symbols was generated, and where nine more time-shifted data streams were generated by delaying the modulated data stream by, e.g., different time shifts, up to $\Delta t_{max}=300$ symbols. Each of the ten resulting data streams were combined (by addition), and the result was divided by 10 to generate an average modulated data stream. In FIG. 5, the top curve shows the power spectral density of the modulated data stream, while the curve beneath shows the power spectral density of the averaged modulated data stream. As shown in FIG. 5, the power spectral density of the averaged modulated data stream is close to 10 dB below the power spectral density of the modulated data stream, as anticipated for N=10 PLLs 100.

Figure 6:
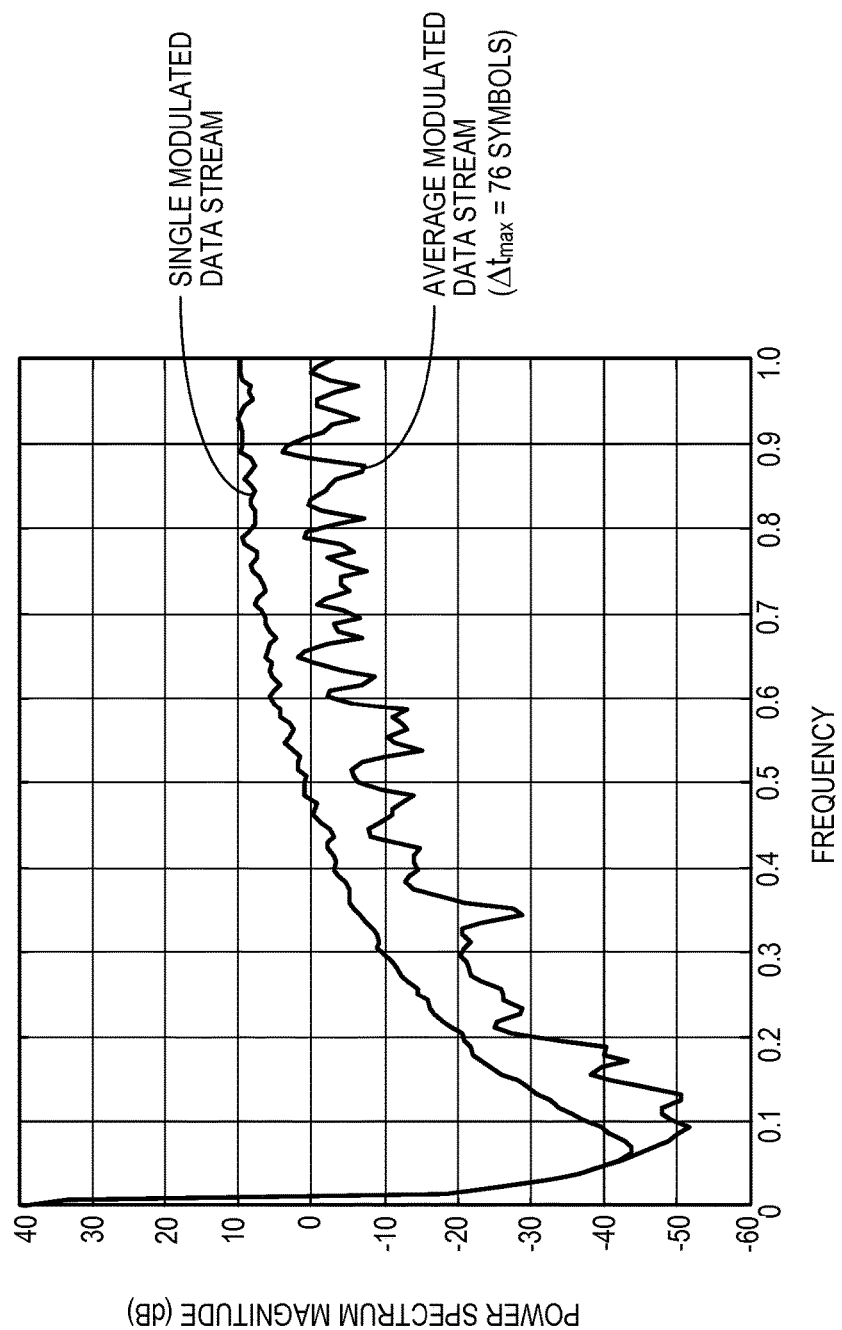
FIG. 6 shows more simulation results for the decorrelation solution described herein.
Figure 7:
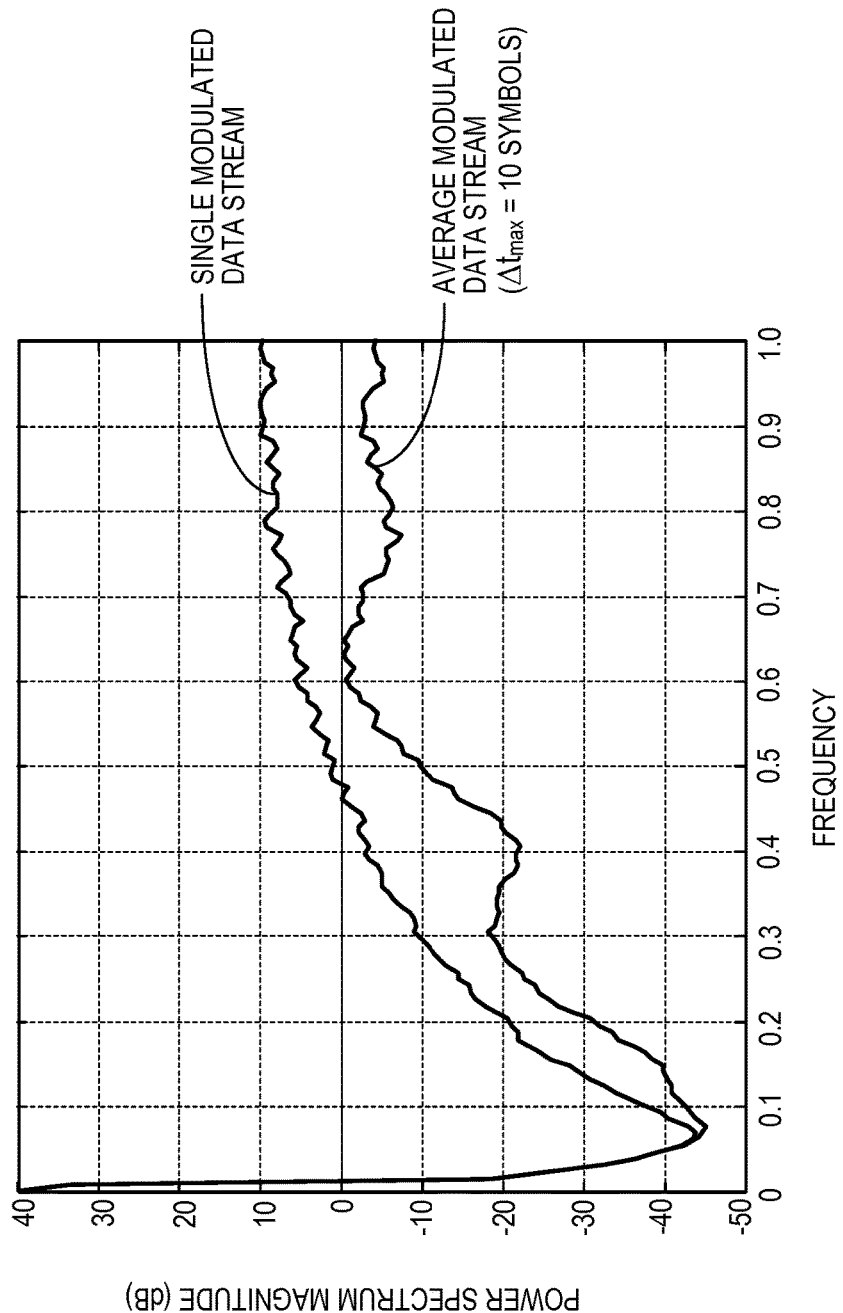
FIG. 7 shows more simulation results for the decorrelation solution described herein.

It will be appreciated that shorter maximum delays may be used, which would allow the delay circuit 220 to, e.g., be implemented with a shorter shift register. For example, FIG. 6 shows the same simulation where the maximum delay is reduced from $\Delta t_{max}=300$ symbols to $\Delta t_{max}=76$ symbols. As shown by FIG. 6, the power spectral density of the averaged modulated data stream is less smooth than the corresponding one in FIG. 5, but still produces the same 10 dB improvement. FIG. 7 shows the same simulation where the maximum delay is further reduced to $\Delta t_{max}=10$ symbols, which provides a low amount of total noise and a low implementation cost, but with a distinct spectral shape. As a general rule, the maximum delay should be no less than $\Delta t_{max}=N$ symbols. As the number N of "independent" PLLs 100 increases, the maximum delay $\Delta t_{max}$ should also increase.

The description associated with FIGS. 2-4 discusses each of the four PLLs 100 receiving the modulated data stream at different times. For example, delay circuit 220 may generate and apply $S_1(t)=S(t-\Delta t_1)$ to $PLL_1$ 100 (where $\Delta t_1 \geq 0$), $S_2(t)=S(t-\Delta t_2)$ to $PLL_2$ 100, $S_3(t)=S(t-\Delta t_3)$ to $PLL_3$ 100, and $S_4(t)=S(t-\Delta t_4)$ to $PLL_4$ 100, where $\Delta t_1<\Delta t_2<\Delta t_3<\Delta t_4$. The solution disclosed herein does not require the delay circuit 220 to apply a different time shift for each PLL 100. In general, any time shift may be used for each PLL 100 receiving a shifted version of the modulated data stream, where each successively time-shifted data stream has a longer time shift relative to the original modulated data stream than the previously time-shifted data stream. Further, while it is preferable that the time-shifted data streams not have equidistant time shifts, it will be appreciated that the solution presented herein does not exclude embodiments having such equidistant time shifts.

Further, the solution presented herein does not require all of the M PLLs 100 in the beamforming system 10 to have a different time shift applied to the input modulated data stream. For example, a frequency control system 100 having a small number of PLLs 100, e.g., 4 PLLs 100, may require each PLL 100 to receive the modulated data stream at a different time. In this case, M=N. However, when there are a larger number of PLLs 100, e.g., more than 10 PLLs 100, some PLLs 100 may receive the same time-shifted version of the modulated data stream. In this case, M>N. For example, if there are M=100 PLLs 100, the PLLs 100 may be divided into ten smaller groups, each having, e.g., ten PLLs 100, where each of the different N=10 groups of PLLs 100 receives a different time-shifted version of the modulated data stream. In this case, N=10 (for the ten independent groups of PLLs 100) and the effective quantization noise will be suppressed by up to 10 dB. While this example used equal sized groups of PLLs 100 (e.g., groups of 10 PLLs 100), it will be appreciated that the different groups of PLLs 100 do not need to have the same number of PLLs 100.

Figure 8:
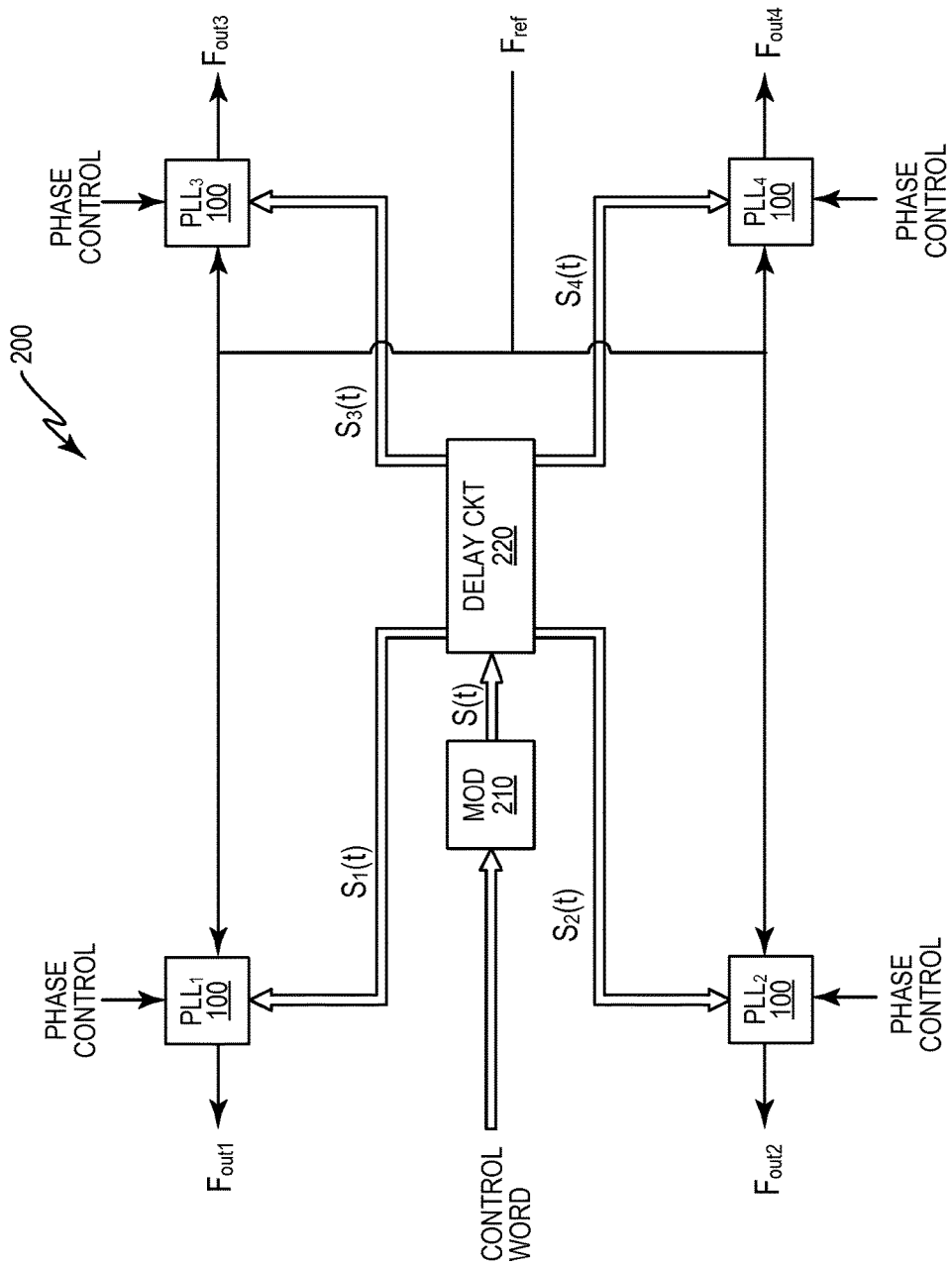
FIG. 8 shows a frequency control system according to another exemplary embodiment.

In addition, FIGS. 2-4 are described in terms of a time delay applied to the modulated data stream generated responsive to the fractional part of the frequency control word. It will be appreciated, however, that the time delay may alternatively be applied to a modulated data stream generated responsive to both the integer and the fractional part of the control word when the entire control word is applied to the modulation circuit 210, as shown in FIG. 8. For example, the modulation circuit 210 may generate the modulated data stream based on the integer and fractional parts of the frequency control word, where the delay circuit 220 then applies the time shift(s) to the resulting first modulated data stream S(t), where in this example, the first modulated data stream S(t) represents the integer and fractional parts of the frequency control word.

Figure 9:
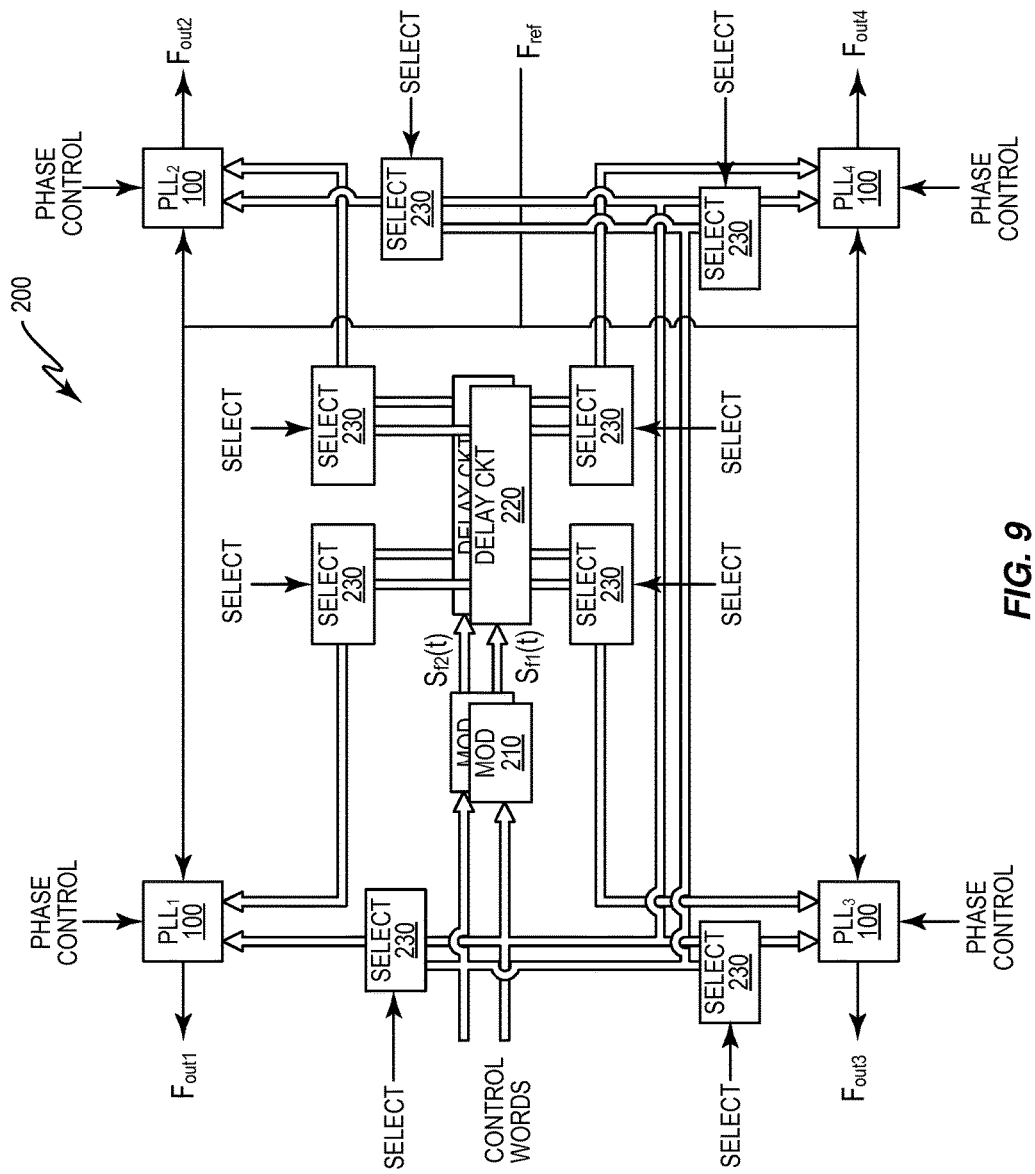
FIG. 9 shows a frequency control system according to another exemplary embodiment.

The solution presented herein may also be used with beamforming systems 10 having different PLLs 100 (or groups of PLLs 100) that output signals at different frequencies. In this case, the frequency control system 100 includes a modulation circuit 210 and delay circuit 220 pair for each frequency, as shown in FIG. 9. In the example of FIG. 9, two groups of PLLs 100 output two different frequencies. Each group of PLLs in this example may, e.g., comprise zero to four PLLs 100. At least the fractional part of the frequency control word associated with the first output frequency is applied to a first modulator 210 to generate a first modulated data stream $S_{f1}(t)$. The corresponding first delay 220 circuit applies the necessary time shift(s) to the first modulated data stream $S_{f1}(t)$ to generate the time-shifted data stream(s) for the first group of PLLs 100 associated with the first frequency. Similarly, at least the fractional part of the frequency control word associated with the second output frequency is applied to a second modulator 210 to generate a second modulated data stream $S_{f2}(t)$. The corresponding second delay circuit 220 applies the necessary time shift(s) to the second modulated data stream $S_{f2}(t)$ to generate the time-shifted data stream(s) for the second group of PLLs 100 associated with the second frequency.

As shown in FIG. 9, a selection circuit 230 is provided for each PLL 100. Each selection circuit 230 selects the frequency control word inputs for that PLL 100, and thus applies the correct integer and time-shifted data stream to the correct PLL 100. If the modulation circuit 210 were to generate the modulated data stream based on the entire frequency control word, e.g., as shown in FIG. 8, each selection circuit 230 would only need to be connected between the delay circuit output and the PLL input.

The solution presented herein reduces the effect of fractional-N quantization noise in beamforming systems. Further, the simple hardware implementation, e.g., a single modulator-delay circuit pair for each desired concurrent frequency, makes the solution presented herein flexible and cost effective.

Various elements disclosed herein are described as some kind of circuit, e.g., a modulation circuit, a delay circuit, a selection circuit, etc. Each of these circuits may be embodied in hardware and/or in software (including firmware, resident software, microcode, etc.) executed on a controller or processor, including an application specific integrated circuit (ASIC).

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of decorrelating quantization noise generated by a plurality of frequency programmable phase-locked loops (PLLs), the method comprising:
   generating a first modulated data stream based on a first frequency control word, the first frequency control word configured to control a first frequency output by at least some of the plurality of PLLs;
   generating a first data stream based on the first modulated data stream;
   shifting the first modulated data stream by a first time shift to generate a second data stream;
   applying the first data stream to a first PLL of the plurality of PLL to produce, at an output of the first PLL, a first output signal at the first frequency and having a first quantization noise component; and
   applying the second data stream to a second PLL of the plurality of PLLs to produce, at an output of the second PLL, a second output signal at the first frequency and having a second quantization noise component decorrelated from the first quantization noise component.

2. The method of claim 1 wherein the first frequency output by the frequency programmable PLLs is controlled by a frequency control value having an integer and non-integer component, and where the first frequency control word comprises the non-integer component.

3. The method of claim 1 further comprising:
   generating a second modulated data stream based on a second frequency control word, the second frequency control word configured to control a second frequency output by at least some of the plurality of PLLs;
   generating a third data stream based on the second modulated data stream;
   shifting the second modulated data stream by a second time shift to generate a fourth data stream; and
   applying the third data stream to a third PLL of the plurality of PLLs to produce, at an output of the third PLL, a third output signal at the second frequency and having a third quantization noise component;
   applying the fourth data stream to a fourth PLL of the plurality of PLLs to produce, at an output of the fourth PLL, a fourth output signal at the second frequency and having a fourth quantization noise component decorrelated from the third quantization noise component.

4. The method of claim 1 further comprising:
   shifting the first modulated data stream by an additional time shift to generate a third data stream, the third data stream being offset in time from the first modulated data stream by more than the first time shift; and
   applying the third data stream to a third PLL of the plurality of PLLs to produce, at an output of the third PLL, a third output signal at the first frequency and having a third quantization noise component decorrelated from the first and second quantization noise components.

5. The method of claim 1 further comprising determining a phase difference between the PLL output signals based on the first time shift, and applying a compensation for the phase difference to at least the second PLL to account for a phase shift caused by the first time shift.

6. A programmable frequency control system for controlling a plurality of frequency programmable phase-locked loops (PLLs), the programmable frequency control system comprising:
   a modulator configured to generate a first modulated data stream based on a first frequency control word input to the modulator, the first frequency control word configured to control a first frequency output by at least some of the plurality of PLLs; and
   a delay circuit operatively coupled to an output of the modulator and configured to:
      generate a first data stream based on the first modulated data stream;
      shift the first modulated data stream by a first time shift to generate a second data stream;
      apply the first data stream to a first PLL of the plurality of PLLs to produce, at an output of the first PLL, a first output signal at the first frequency and having a first quantization noise component; and
      apply the second data stream to a second PLL of the plurality of PLLs to produce, at an output of the second PLL, a second output signal at the first frequency and having a second quantization noise component decorrelated from the first quantization noise component.

7. The programmable frequency control system of claim 6 wherein the first frequency output by the frequency programmable PLLs is controlled by a frequency control value having an integer and non-integer component, and where the first frequency control word comprises the non-integer component.

8. The programmable frequency control system of claim 6 wherein the delay circuit is further configured to shift the first modulated data stream by a second time shift to generate the first data stream, wherein the first time shift exceeds the second time shift.

9. The programmable frequency control system of claim 6 further comprising:
   a second modulator configured to generate a second modulated data stream based on a second frequency control word input to the second modulator, the second frequency control word configured to control a second frequency output by at least some of a second plurality of PLLs;
   a second delay circuit operatively coupled to an output of the second modulator and configured to:
      generate a third data stream based on the second modulated data stream; and
      shift the second modulated data stream by a second time shift to generate a fourth data stream;
   wherein the programmable frequency control system is further configured to:
      apply the third data stream to a third PLL of the plurality of PLLs to produce, at an output of the third PLL, a third output signal at the second frequency and having a third quantization noise component; and
      apply the fourth data stream to a fourth PLL of the plurality of PLLs to produce, at an output of the third PLL, a fourth output signal at the second frequency and having a fourth quantization noise component decorrelated from the third quantization noise component.

10. The programmable frequency control system of claim 9 further comprising a plurality of selection circuits, each of the selection circuits operatively coupled between the first and second delay circuits and the corresponding PLL, wherein each selection circuit is configured to apply a selected data stream output by one of the delay circuits to the corresponding PLL.

11. The programmable frequency control system of claim 6 wherein the delay circuit is further configured to:
   shift the first modulated data stream by an additional time shift to generate a third data stream, the third data stream being offset in time from the first modulated data stream by more than the first time shift; and
   apply the third modulated data stream to a third PLL of the plurality of PLLs to produce, at an output of the third PLL, a third output signal at the first frequency and having a third quantization noise component decorrelated from the first and second quantization noise components.

12. The programmable frequency control system of claim 6 wherein the modulator comprises a delta-sigma modulator.

13. The programmable frequency control system of claim 6 wherein the delay circuit comprises a shift register.

14. The programmable frequency control system of claim 6 wherein at least the second PLL is further configured to implement a phase correction determined based on the first time shift, and wherein the phase correction accounts for a phase shift caused by the first time shift.

15. A computer program product stored in a non-transitory computer readable medium for decorrelating quantization noise produced by a plurality of frequency programmable phase-locked loops (PLLs), the computer program product comprising software instructions which, when run in a wireless control circuit, causes the wireless control circuit to:
   generate a first modulated data stream based on a first frequency control word, the first frequency control word configured to control a first frequency output by at least some of the plurality of PLLs;
   generate a first data stream based on the first modulated data stream;
   shift the first modulated data stream by a first time shift to generate a second data stream;
   apply the first data stream to a first PLL of the plurality of PLLs to produce, at an output of the first PLL, a first output signal at the first frequency and having a first quantization noise component; and
   apply the second data stream to a second PLL of the plurality of PLLs to produce, at an output of the second PLL, a second output signal at the first frequency and having a second quantization noise component decorrelated from the first quantization noise component.

16. A beamforming system comprising a programmable frequency control system for controlling a plurality of frequency programmable phase-locked loops (PLLs), the programmable frequency control system comprising:
   a modulator configured to generate a first modulated data stream based on a first frequency control word input to the modulator, the first frequency control word configured to control a first frequency output by at least some of the plurality of PLLs; and
   a delay circuit operatively coupled to an output of the modulator and configured to:

generate a first data stream based on the first modulated data stream;

shift the first modulated data stream by a first time shift to generate a second data stream;

apply the first data stream to a first PLL of the plurality of PLLs to produce, at an output of the first PLL, a first output signal at the first frequency and having a first quantization noise component; and apply the second data stream to a second PLL of the plurality of PLLs to produce, at an output of the second PLL, a second output signal at the first frequency and having a second quantization noise component decorrelated from the first quantization noise component.

17. The beamforming system of claim 16 wherein the first frequency output by the frequency programmable PLLs is controlled by a frequency control value having an integer and non-integer component, and where the first frequency control word comprises the non-integer component.

18. The beamforming system of claim 16 wherein the delay circuit is further configured to shift the first modulated data stream by a second time shift to generate the first data stream, wherein the first time shift exceeds the second time shift.

19. The beamforming system of claim 16, wherein the programmable frequency control system further comprises:

a second modulator configured to generate a second modulated data stream based on a second frequency control word input to the second modulator, the second frequency control word configured to control a second frequency output by at least some of a second plurality of PLLs;

a second delay circuit operatively coupled to an output of the second modulator and configured to:

generate a third data stream based on the second modulated data stream; and shift the second modulated data stream by a second time shift to generate a fourth data stream;

wherein the programmable frequency control system is further configured to:

apply the third data stream to a third PLL of the plurality of PLLs to produce, at an output of the third PLL, a third output signal at the second frequency and having a third quantization noise component; and apply the fourth data stream to a fourth PLL of the plurality of PLLs to produce, at an output of the third PLL, a fourth output signal at the second frequency and having a fourth quantization noise component decorrelated from the third quantization noise component.

20. The beamforming system of claim 16 wherein the delay circuit is further configured to:

shift the first modulated data stream by an additional time shift to generate a third data stream, the third data stream being offset in time from the first modulated data stream by more than the first time shift; and apply the third modulated data stream to a third PLL of the plurality of PLLs to produce, at an output of the third PLL, a third output signal at the first frequency and having a third quantization noise component decorrelated from the first and second quantization noise components.

* * * * *